US012666681B2

(12) United States Patent
Li et al.

(10) Patent No.: US 12,666,681 B2
(45) Date of Patent: Jun. 23, 2026

(54) SEMICONDUCTOR STRUCTURE AND FABRICATING METHOD OF THE SAME

(71) Applicant: UNITED MICROELECTRONICS CORP., Hsin-Chu City (TW)

(72) Inventors: Yi-Fan Li, Tainan City (TW); Chen-Ming Wang, Kaohsiung City (TW); Po-Ching Su, Tainan City (TW); Pei-Hsun Kao, Kaohsiung City (TW); Ti-Bin Chen, Tainan City (TW); Chun-Wei Yu, Tainan City (TW); Chih-Chiang Wu, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 488 days.

(21) Appl. No.: 18/379,674

(22) Filed: Oct. 13, 2023

(65) Prior Publication Data

US 2025/0089334 A1    Mar. 13, 2025

(30) Foreign Application Priority Data

Sep. 8, 2023    (TW) ................................. 112134220

(51) Int. Cl.
| | |
|---|---|
| *H10D 64/23* | (2025.01) |
| *H10D 30/01* | (2025.01) |
| *H10D 30/60* | (2025.01) |
| *H10D 30/69* | (2025.01) |
| *H10D 62/83* | (2025.01) |
| *H10D 64/01* | (2025.01) |
| *H10D 64/62* | (2025.01) |

(52) U.S. Cl.
CPC ......... *H10D 64/251* (2025.01); *H10D 30/022* (2025.01); *H10D 30/601* (2025.01); *H10D 30/792* (2025.01); *H10D 62/83* (2025.01); *H10D 64/015* (2025.01); *H10D 64/021* (2025.01); *H10D 64/62* (2025.01)

(58) Field of Classification Search
None
See application file for complete search history.

(56) References Cited

U.S. PATENT DOCUMENTS

| | | | | |
|---|---|---|---|---|
| 6,632,745 B1 * | 10/2003 | Yap | ...................... | H10D 64/015 |
| | | | | 438/738 |
| 2005/0093075 A1 * | 5/2005 | Bentum | ............... | H10D 62/021 |
| | | | | 257/E29.267 |
| 2007/0034906 A1 | 2/2007 | Wang | | |
| 2007/0298557 A1 * | 12/2007 | Nieh | .................... | H10D 62/371 |
| | | | | 257/E29.267 |
| 2007/0298565 A1 * | 12/2007 | Nieh | .................... | H10D 30/797 |
| | | | | 257/E29.267 |
| 2008/0254579 A1 * | 10/2008 | Chi | .................... | H10D 30/0227 |
| | | | | 257/E29.345 |
| 2009/0081840 A1 * | 3/2009 | Park | .................... | H10D 62/021 |
| | | | | 257/E21.409 |

(Continued)

*Primary Examiner* — Cory W Eskridge
(74) *Attorney, Agent, or Firm* — Winston Hsu

(57) ABSTRACT

A semiconductor includes a substrate. A gate structure is disposed on the substrate. A liner oxide contacts a side of the gate structure. A silicon oxide spacer contacts the liner oxide. An end of the silicon oxide spacer forms a kink profile. A silicon nitride spacer contacts the silicon oxide spacer and a tail of the silicon nitride spacer covers part of the kink profile. A stressor covers the silicon nitride spacer and the substrate.

19 Claims, 4 Drawing Sheets

(56)          References Cited

U.S. PATENT DOCUMENTS

| | | | |
|---|---|---|---|
| 2009/0294866 A1* | 12/2009 | Eller | .................... H10D 64/017 |
| | | | 438/231 |
| 2014/0242770 A1 | 8/2014 | Huang | |
| 2016/0071954 A1* | 3/2016 | Hoentschel | ........ H10D 30/0212 |
| | | | 438/301 |
| 2022/0069107 A1* | 3/2022 | Han | .................... H10D 30/605 |

* cited by examiner

SEMICONDUCTOR STRUCTURE AND FABRICATING METHOD OF THE SAME

BACKGROUND OF THE INVENTION

1. Field of the Invention

The present invention relates to a semiconductor structure, and in particular to a transistor structure with a kink profile on a spacer and a manufacturing method thereof.

2. Description of the Prior Art

The electronics industry has a growing demand for smaller and faster electronic devices that can support more and more complex and sophisticated functions. In order to realize these needs, manufacturing low cost, high efficiency and low power consumption integrated circuits is a continuing trend in the integrated circuit industry. Currently, these goals have been largely achieved by shrinking the size of integrated circuits, thereby improving production efficiency and reducing costs.

For traditional MOS transistors, carrier mobility degradation may occur due to shrinkage of component sizes, resulting in poor electrical properties and thus affecting the operating efficiency, making it unsuitable for high-speed operation. Generally speaking, under a fixed electric field, for a MOS transistor, the amount of current flowing through the channel region will be proportional to the carrier mobility in the channel region. Therefore, how to improve the carrier mobility to increase the performance of MOS transistors has become a major issue in the semiconductor technology.

SUMMARY OF THE INVENTION

In view of this, the present invention provides a semiconductor structure and a manufacturing method that make the stressor to evenly apply stress to the channel region.

According to a preferred embodiment of the present invention, a semiconductor structure includes a substrate. A gate structure is disposed on the substrate. A liner oxide contacts a side of the gate structure. A silicon oxide spacer contacts the liner oxide, wherein an end of the silicon oxide spacer forms a kink profile. A silicon nitride spacer contacts the silicon oxide spacer. A tail of the silicon nitride spacer covers part of the kink profile. A stressor covers the silicon nitride spacer and the substrate.

According to another preferred embodiment of the present invention, a fabricating method of a semiconductor structure includes providing a substrate. Next, a gate structure is formed to be disposed on the substrate. Later, a liner oxide is formed to contact a side of the gate structure. Subsequently, a silicon oxide spacer is formed to contact the liner oxide, wherein an end of the silicon oxide spacer forms a kink profile. Next, a silicon nitride spacer is formed to contact the silicon oxide spacer, wherein a tail of the silicon nitride spacer covers part of the kink profile. Finally, a stressor is formed to cover the silicon nitride spacer and the substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1 to 6 depict a fabricating method of a semiconductor structure according to a preferred embodiment of the present invention, wherein:

FIG. 1 depicts a substrate with a dummy gate structure;

FIG. 2 is a fabricating stage in continuous of FIG. 1;

FIG. 3 is a fabricating stage in continuous of FIG. 2;

FIG. 4 is a fabricating stage in continuous of FIG. 3;

FIG. 5 is a fabricating stage in continuous of FIG. 4; and

FIG. 6 is a fabricating stage in continuous of FIG. 5.

DETAILED DESCRIPTION

FIGS. 1 to 6 depict a fabricating method of a semiconductor structure according to a preferred embodiment of the present invention.

Figure 1:
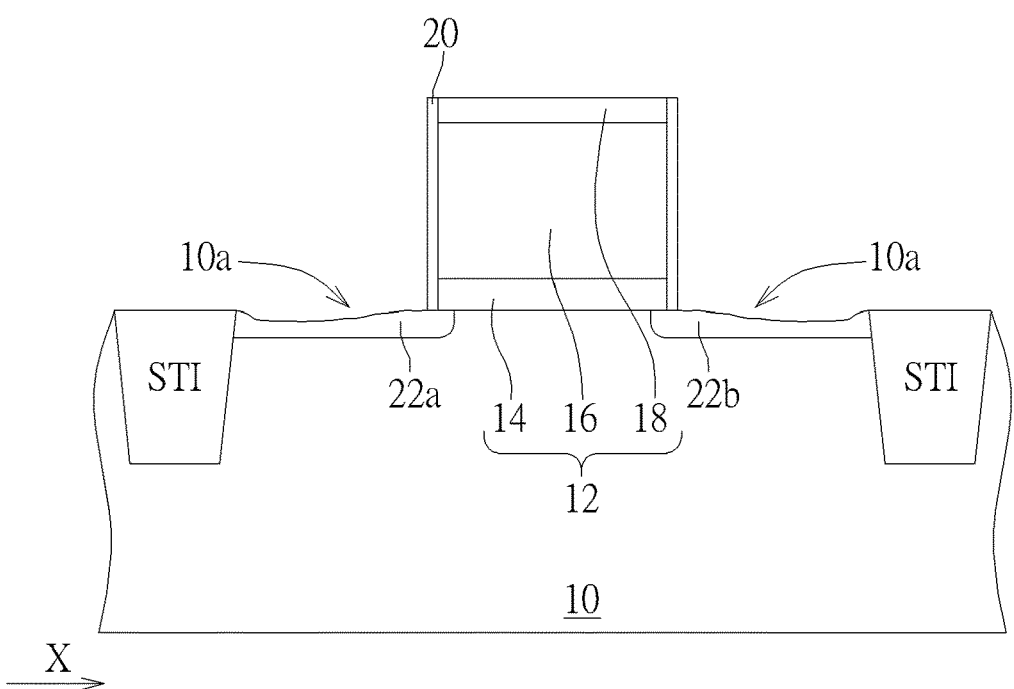

As shown in FIG. 1, a substrate 10 is provided. The substrate 10 includes a silicon substrate, a germanium substrate, a gallium arsenide substrate, a silicon germanium substrate, an indium phosphide substrate, a gallium nitride substrate, a silicon carbide substrate or a silicon on insulator substrate.

A shallow trench isolation is embedded in the substrate 10 to define an active area. The shallow trench isolation may include silicon oxide. Then, a dummy gate structure 12 is formed on the substrate 10. The dummy gate structure 12 includes a gate dielectric layer 14, a polysilicon layer 16 and a capping layer 18 stacked from bottom to top. Then, a liner oxide 20 is formed to contact two sides of the dummy gate structure 12. The liner oxide 20 is preferably silicon oxide. Later, an ion implantation process is performed to implant dopants to form two lightly doping regions 22a/22b in the substrate 10 at two sides of the dummy gate structure 12 by taking the dummy gate structure 12 and the liner oxide 20 as a mask. During the ion implantation process, the surface of the substrate 10 is bombarded by dopants, therefore the damaged surface of the substrate 10 forms a concave and convex surface 10a. The method of forming the liner oxide 20 may include forming an oxide layer (not shown) and then performing an etching back process, but is not limited to this method.

Figure 2:
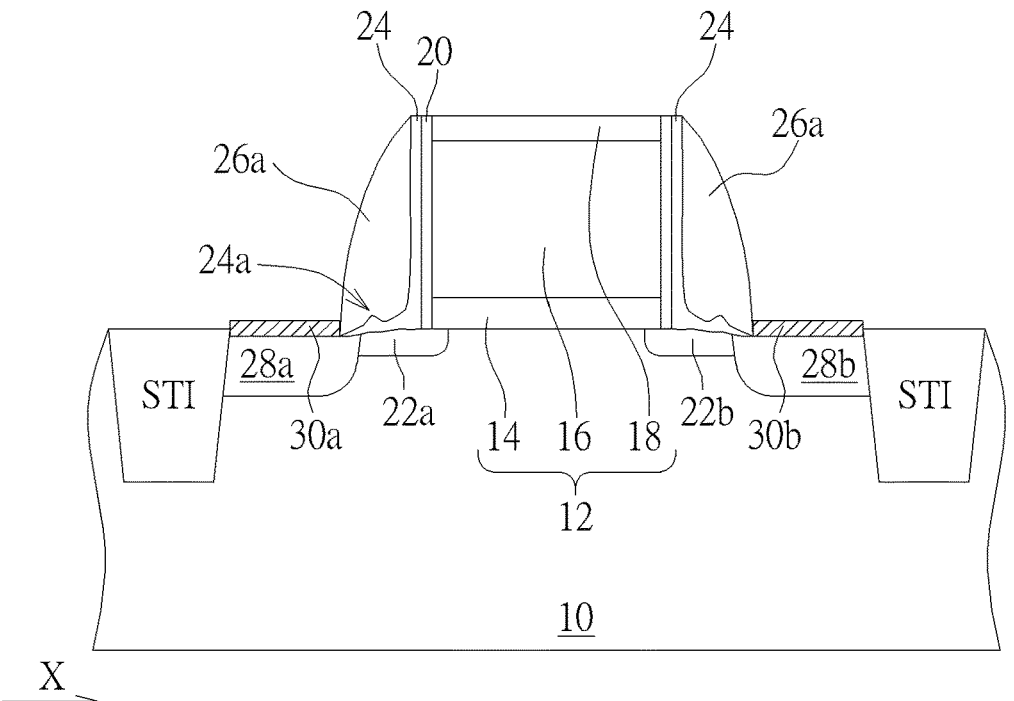

As shown in FIG. 2, a first spacer material layer (not shown) and a second spacer material layer (not shown) are sequentially formed to cover the substrate 10, the liner oxide 20 and the dummy gate structure 12. The first spacer material layer is silicon oxide. The second spacer material layer is silicon nitride. The first spacer material layer covers and fills in the concave and convex surface 10a. Then, a first dry etching is performed to etch the first spacer material layer and the second spacer material layer to form a silicon oxide spacer 24 and a first silicon nitride spacer 26a. Next, an ion implantation process is performed to form a source 28a and a drain 28b in the substrate 10 at two sides of the dummy gate structure 12 by taking the dummy gate structure 12, the liner oxide 20, the silicon oxide spacer 24 and the first silicon nitride spacer 26a as a mask. The implanted dopants may include N-type or P-type dopants. Later, silicides 30a/30b are respectively formed on the surface of the source 28a and the drain 28b.

Figure 3:
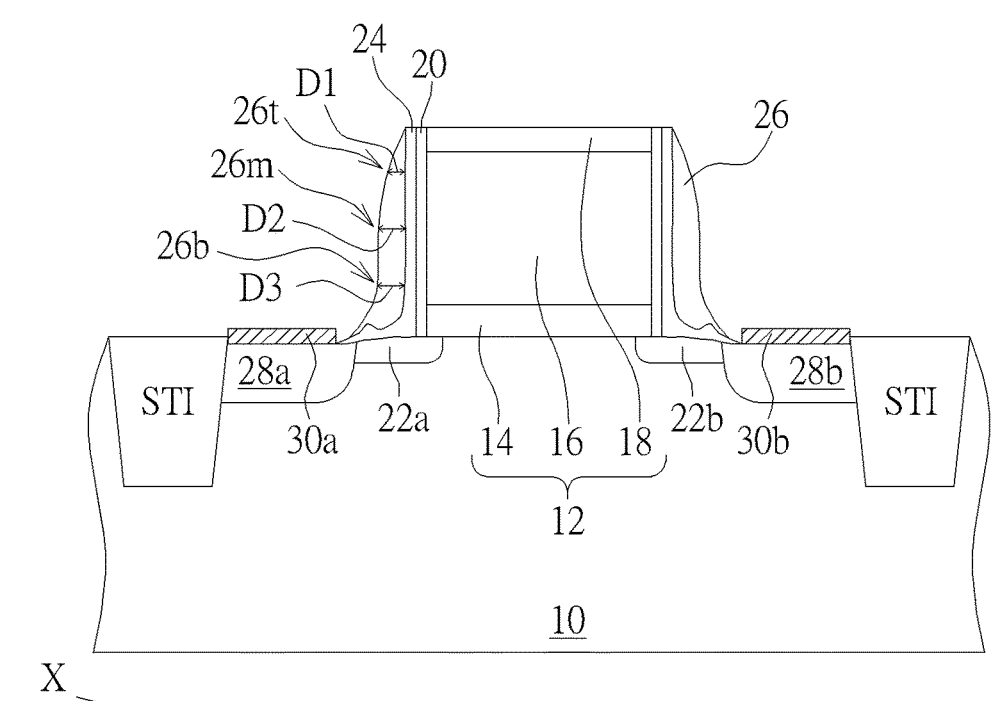
Figure 7:
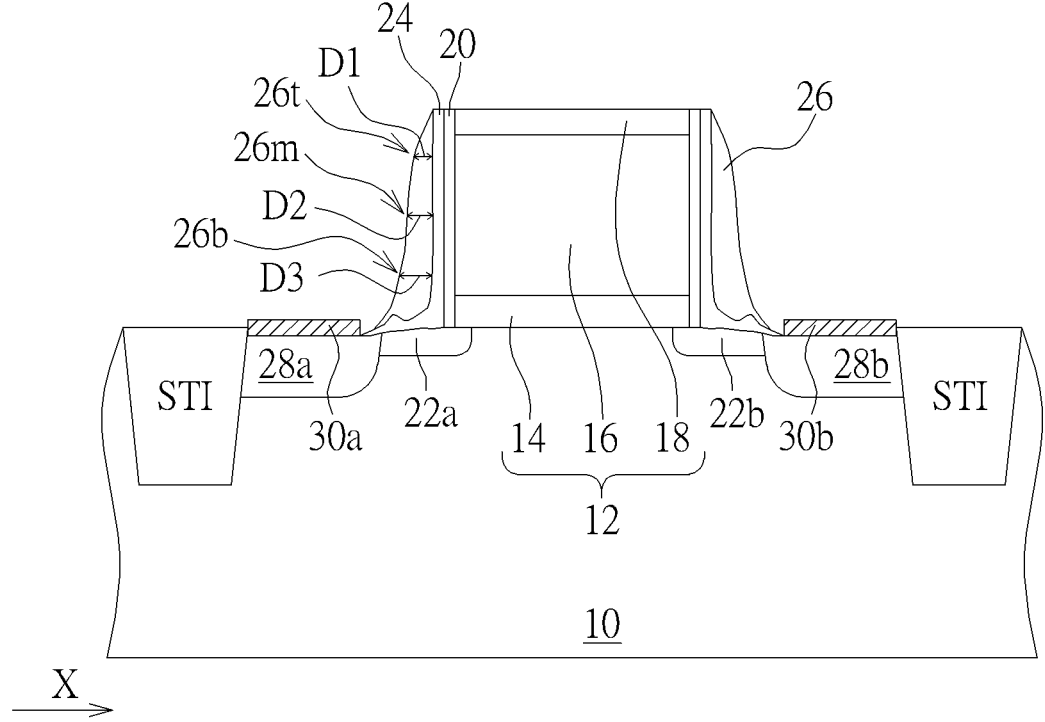
FIG. 7 depicts a varied type of a silicon nitride spacer.

As shown in FIG. 3, a second dry etching is performed to etch the first silicon nitride spacer 26a. Following the second dry etching, a wet etching is performed to etch the first silicon nitride spacer 26a to form a silicon nitride spacer 26. According to a preferred embodiment of the present invention, the second dry etching includes using $CF_4$ or $CH_3F$ as etchant. The wet etching includes using phosphoric acid aqueous solution to etch, and the phosphoric acid aqueous solution is at a temperature between 80° C. and 150° C., and a concentration of the phosphoric acid aqueous solution is between 50% and 85%. According to the different operating conditions of the second dry etching and the wet etching, the thickness of the silicon nitride spacer 26 can be different. For example, the silicon nitride spacer 26 is divided into a top part 26t, a middle part 26m and a bottom part 26b, and the top part 26t is farther away from the substrate 10, the bottom part 26b is closer to the substrate 10, the middle part 26m is located between the top part and the bottom part. A direction X is parallel to a surface of the substrate 10 directly below the dummy gate structure 12. Along the direction X, the top part 26t includes a first thickness D1, the middle part 26m includes a second thickness D2, the bottom part 26b includes a third thickness D3. The first thickness D1, the second thickness D2 and the third thickness D3 are all along the direction X. The first thickness D1 is smaller than the second thickness D2, and the third thickness D3 is not smaller than the second thickness D2. In FIG. 3, it is taken as an example that the second thickness D2 is the same as the third thickness D3. However, in FIG. 7, the third thickness D3 is greater than the second thickness D2.

Figure 4:
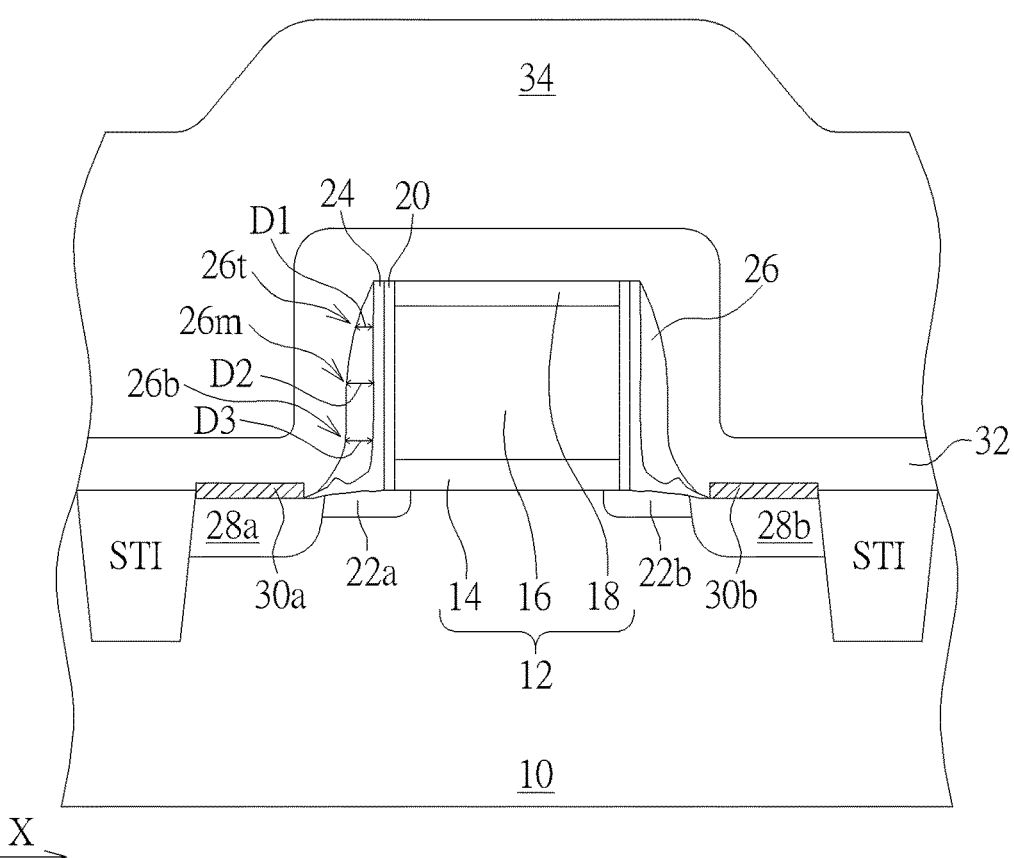

FIG. 4 shows steps following FIG. 3. As shown in FIG. 4, a stressor 32 is formed to cover the substrate 10, the liner oxide 20, the silicon oxide spacer 24, the silicon nitride spacer 26 and the dummy gate structure 12. The stressor layer 32 is used to apply tensile or compressive stress to the channel region (not shown) under the dummy gate structure 12. The stressor 32 can also serve as an etching stop layer for a subsequent dry etching to form conductive plugs. The stressor 32 is preferably silicon nitride. After that, a dielectric layer 34 is formed to cover the stressor 32.

Figure 5:
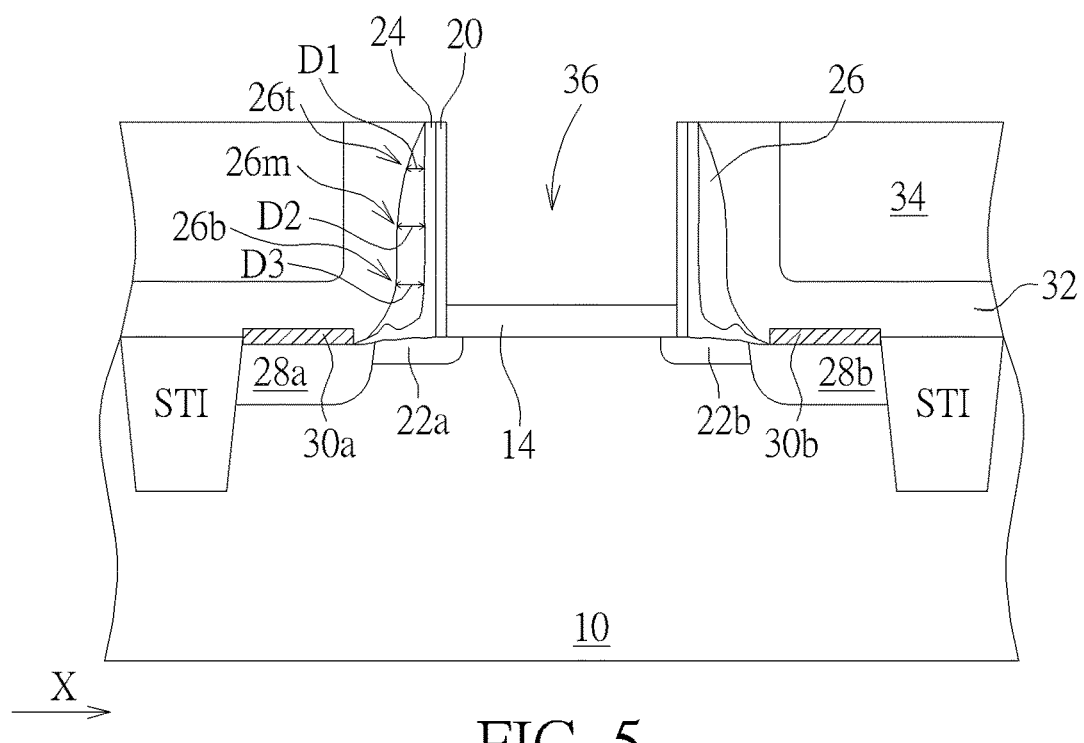
Figure 6:
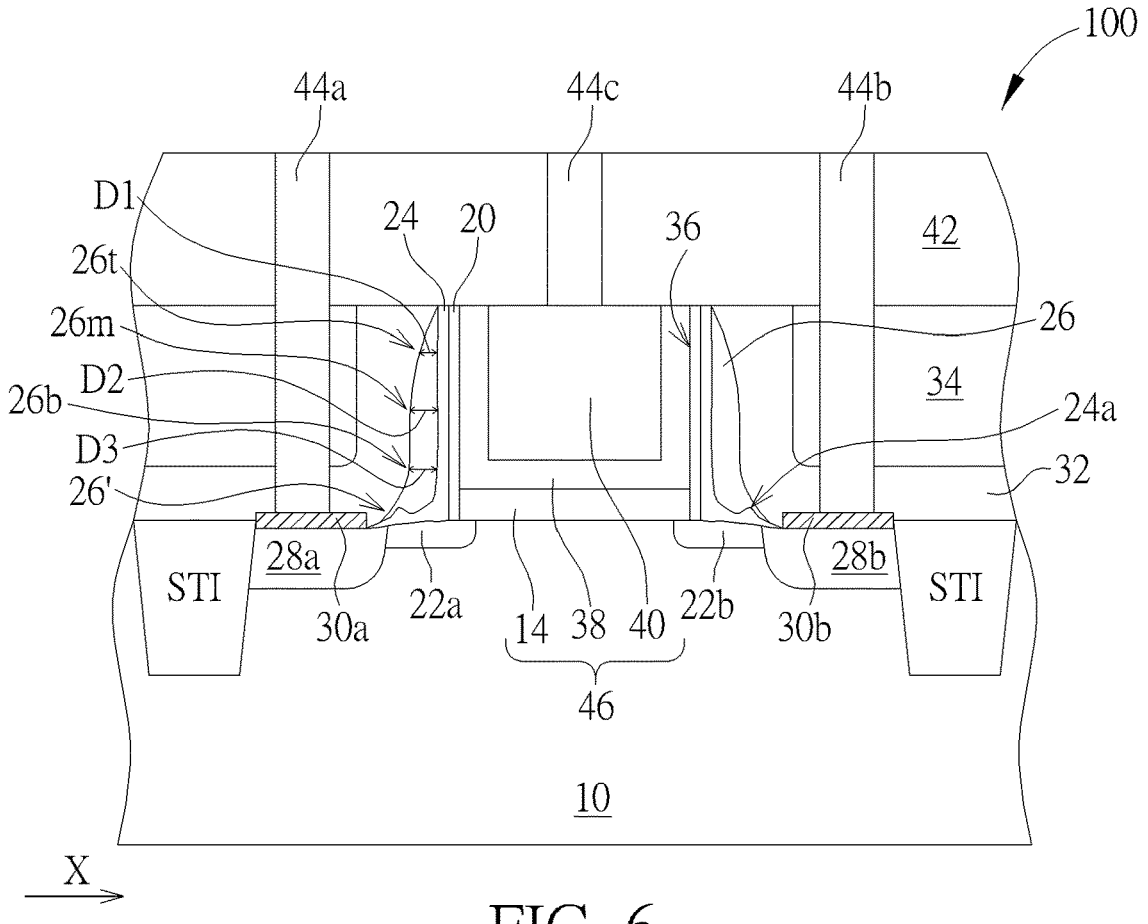

As shown in FIG. 5, a chemical mechanical polishing (CMP) is performed to remove the stressor 32 and the dielectric layer 34 on the dummy gate structure 12, so that the dummy gate structure 12 is exposed. Then, the capping layer 18 and the polysilicon layer 16 of the dummy gate structure 12 are removed to form a recess 36. As shown in FIG. 6, a material layer 38 is formed to fill in the recess 36. The material layer 38 may include a work function layer and a barrier. The material layer 38 is preferably U-shaped. Later, a metal gate 40 is formed to fill the recess. The metal gate 40 includes tungsten or aluminum. Next, an interlayer dielectric layer 42 is formed to cover the stressor 32, and then conductive plugs 44a/44b/44c are formed. The conductive plugs 44a/44b penetrate the interlayer dielectric layer 42, the dielectric layer 34 and the stressor 32 and respectively contact the silicide 30a on the source 28a and the silicide 30b on the drain 28b. The conductive plug 44c penetrates the interlayer dielectric layer 42 and contacts the metal gate 40. Now, a semiconductor structure 100 of the present invention is completed. According to a preferred embodiment of the present invention, the conductive plugs 44a/44b/44c may be formed by performing a dry etching to etch through the interlayer dielectric layer 42 and the dielectric layer 34 by using a patterned mask (not shown). The dry etching uses the stressor 32 as an etching stop layer. Later, a wet etching and/or a dry etching is performed to etch through the stressor 32 to form via holes, and silicides 30a/30b on the surface of the source 28a and the drain 28b are exposed through via holes. Subsequently, a conductive layer is filled in the via holes and then the conductive layer is planarized. The conductive plugs 44a/44b/44c include aluminum or other metals, and the silicides 30a/30b include nickel silicide or other metal silicides.

As shown in FIG. 6, a semiconductor structure 100 includes a substrate 10, and a gate structure 46 is disposed on the substrate 10. The gate structure 46 includes a gate dielectric layer 14, a material layer 38 and a metal gate 40. The gate dielectric layer 14 contacts the substrate 10, and the material layer 38 is disposed between the metal gate 40 and the gate dielectric layer 14. The gate dielectric layer 14 includes a high-k dielectric material, such as $HfO_2$, $HfSiO_4$, HfSiON or $Al_2O_3$. The material layer 38 includes a work function layer and a barrier. For example, the material layer 38 may include TIN, TaN, TaAl, or WN, and the metal gate 40 may include Al, Ti, Ta, W, or Cu. A liner oxide 20 contacts one side of the gate structure 46, and the liner oxide 20 is preferably silicon oxide. A silicon oxide spacer 24 contacts the liner oxide 20. A silicon oxide spacer 24 contacts the liner oxide 20, wherein an end of the silicon oxide spacer 24 forms a kink profile 24a. The substrate 10 at two sides of the gate structure 46 includes a concave and convex surface 10a (shown in FIG. 1), and the kink profile 24a contacts and covers the concave and convex surface 10a. A silicon nitride spacer 26 contacts the silicon oxide spacer 24. A tail 26' of the silicon nitride spacer 26 covers a portion of the kink profile 24a. A surface of the tail 26' and a surface of the kink profile 24a together form a non-pointed surface. A stressor 32 covers the gate structure 46, the silicon nitride spacer 26 and the substrate 10. The stressor 32 may be silicon nitride.

In addition, two lightly doping regions 22a/22b are respectively disposed in the substrate 10 at two sides of the gate structure 46. A source 28a and a drain 28b are respectively disposed in the substrate 10 at two sides of the gate structure 46. The source 28a partially overlaps the lightly doping region 22a, and the drain 28b partially overlaps the lightly doping region 22b. The lightly doping regions 22a/22b can extend to be directly under the gate structure 46. Two silicides 30a/30b are respectively disposed on the source 28a and the drain 28b. The stressor 32 contacts the silicides 30a/30b, and the conductive plugs 44a/44b penetrate the stressor 32 and contact the silicides 30a/30b respectively.

Moreover, the silicon nitride spacer 26 is divided into a top part 26t, a middle part 26m and a bottom part 26b, and the top part 26t is farther away from the substrate 10, the bottom part 26b is closer to the substrate 10, the middle part 26m is located between the top part and the bottom part. The tail 26' extends from the bottom part 26b. A direction X is parallel to a surface of the substrate 10 directly below the dummy gate structure 12. Along the direction X, the top part 26t includes a first thickness D1, the middle part 26m includes a second thickness D2, the bottom part 26b includes a third thickness D3. The first thickness D1, the second thickness D2 and the third thickness D3 are all along the direction X. the first thickness D1 is smaller than the second thickness D2, and the third thickness D3 is not smaller than the second thickness D2. In FIG. 6, it is taken as an example that the second thickness D2 is the same as the third thickness D3. However, in FIG. 7, the third thickness D3 is greater than the second thickness D2.

Since the surface of the substrate is damaged during the formation of the lightly doping regions, causing the surface of the substrate to form a concave and convex surface. Therefore, the silicon oxide spacer covering the concave and convex surface forms a kink profile. The kink profile causes the stressor to be unable to apply stress in the channel region uniformly. In the present invention, after the source and drain are completed, a dry etching and a wet etching are used to thin the outmost spacer, i.e. to thin the silicon nitride spacer. This allows the profile of the silicon nitride spacer to compensate for the kink profile. The tail of the silicon nitride spacer is used to cover and connect the kink profile, so that the kink profile is no longer a pointed surface around the adjacent area. Furthermore, Combined with the profile of the silicon nitride spacer, a surface without kink profile can be formed on two sides of the gate structure, so that the stress can be uniformly applied to the channel region by the stressor.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
a substrate;
a gate structure disposed on the substrate;
a liner oxide contacting a side of the gate structure;
a silicon oxide spacer contacting the liner oxide, wherein an end of the silicon oxide spacer forms a kink profile;
a silicon nitride spacer contacting the silicon oxide spacer, wherein a tail of the silicon nitride spacer covers part of the kink profile; and
a stressor covering the silicon nitride spacer and the substrate.

2. The semiconductor structure of claim 1, wherein the substrate at one side of the gate structure comprises a concave and convex surface, and the kink profile contacts and covers the concave and convex surface.

3. The semiconductor structure of claim 1, wherein a surface of the tail and a surface of the kink profile together form a non-pointed surface.

4. The semiconductor structure of claim 1, wherein the silicon nitride spacer is divided into a top part, a middle part and a bottom part, and the top part is farther away from the substrate, the bottom part is closer to the substrate, the middle part is located between the top part and the bottom part, and the tail extends from the bottom part.

5. The semiconductor structure of claim 4, wherein a direction is parallel to a surface of the substrate directly below the gate structure, the top part comprises a first thickness, the middle part comprises a second thickness, the bottom part comprises a third thickness, the first thickness, the second thickness and the third thickness are all along the direction, the first thickness is smaller than the second thickness, and the third thickness is not smaller than the second thickness.

6. The semiconductor structure of claim 5, wherein the third thickness is greater than the second thickness.

7. The semiconductor structure of claim 1, further comprising:
two lightly doping regions respectively disposed in the substrate at two sides of the gate structure;
a source and a drain respectively disposed in the substrate at two sides of gate structure;
two silicides respectively disposed on the source and the drain, wherein the stressor contacts the two silicides; and
two conductive plugs penetrating the stressor and respectively contacting each of the two silicides.

8. The semiconductor structure of claim 1, wherein the gate structure comprises:
a gate dielectric layer contacting the substrate; and
a metal gate disposed on the gate dielectric layer.

9. A fabricating method of a semiconductor structure, comprising:
providing a substrate;
forming a gate structure disposed on the substrate;
forming a liner oxide contacting a side of the gate structure;
forming a silicon oxide spacer contacting the liner oxide, wherein an end of the silicon oxide spacer forms a kink profile;
forming a silicon nitride spacer contacting the silicon oxide spacer, wherein a tail of the silicon nitride spacer covers part of the kink profile; and
forming a stressor covering the silicon nitride spacer and the substrate.

10. The fabricating method of a semiconductor structure of claim 9, wherein steps of fabricating the silicon nitride spacer comprise:
forming a first silicon nitride spacer;
performing a dry etching to etch the first silicon nitride spacer; and
after the dry etching, performing a wet etching to etch the first silicon nitride spacer to form the silicon nitride spacer.

11. The fabricating method of a semiconductor structure of claim 10, further comprising:
before performing the dry etching, performing a first ion implantation process to form a source and a drain in the substrate at two sides of the gate structure;
before performing the dry etching, forming two silicides respectively disposed on the source and the drain, wherein the stressor contacts the two silicides; and
after forming the stressor, forming two conductive plugs to penetrate the stressor and respectively contact the source and the drain.

12. The fabricating method of a semiconductor structure of claim 10, wherein the dry etching comprises using $CF_4$ or $CH_3F$ as etchant gas.

13. The fabricating method of a semiconductor structure of claim 10, wherein the wet etching comprises performing the wet etching by using phosphoric acid aqueous solution at a temperature between 80° C. and 150° C., and a concentration of the phosphoric acid aqueous solution is between 50% and 85%.

14. The fabricating method of a semiconductor structure of claim 9, further comprising after forming the liner oxide and before forming the silicon oxide spacer, performing a second ion implantation process, wherein the second ion implantation process comprises:
implanting dopants to form two lightly doping regions in the substrate at two sides of the gate structure by taking the gate structure and the silicon oxide spacer as a mask, wherein during the second ion implantation process, the surface of the substrate is bombarded to form a concave and convex surface, and the silicon oxide spacer contacting the concave and convex surface forms the kink profile.

15. The fabricating method of a semiconductor structure of claim 9, wherein a surface of the tail and a surface of the kink profile together form a non-pointed surface.

16. The fabricating method of a semiconductor structure of claim 9, wherein the silicon nitride spacer is divided into a top part, a middle part and a bottom part, and the top part is farther away from the substrate, the bottom part is closer to the substrate, the middle part is located between the top part and the bottom part, and the tail extends from the bottom part.

17. The fabricating method of a semiconductor structure of claim 16, wherein a direction is parallel to a surface of the substrate directly below the gate structure, the top part comprises a first thickness, the middle part comprises a second thickness, the bottom part comprises a third thickness, the first thickness, the second thickness and the third thickness are all along the direction, the first thickness is smaller than the second thickness, and the third thickness is not smaller than the second thickness.

18. The fabricating method of a semiconductor structure of claim 17, wherein the third thickness is greater than the second thickness.

19. The fabricating method of a semiconductor structure of claim 9, wherein the gate structure comprises:

a gate dielectric layer contacting the substrate; and
a metal gate disposed on the gate dielectric layer.

* * * * *